United States Patent
Tauchen et al.

(10) Patent No.: US 6,411,230 B1
(45) Date of Patent: Jun. 25, 2002

(54) CIRCUIT ARRANGEMENT FOR PARALLEL/SERIAL CONVERSION

(75) Inventors: Günter Tauchen, Quickborn; Jürgen Plog, Hamburg, both of (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/719,735

(22) PCT Filed: Apr. 13, 2000

(86) PCT No.: PCT/EP00/03399

§ 371 (c)(1),
(2), (4) Date: Dec. 14, 2000

(87) PCT Pub. No.: WO00/64056

PCT Pub. Date: Oct. 26, 2000

(51) Int. Cl.⁷ .................................................. H03M 9/00
(52) U.S. Cl. ........................................ 341/101; 341/100
(58) Field of Search ................................. 341/100, 101, 341/61, 59, 141

(56) References Cited

U.S. PATENT DOCUMENTS

| | | | | |
|---|---|---|---|---|
| 5,055,842 A | * | 10/1991 | Mueller | 341/100 |
| 5,319,369 A | * | 6/1994 | Majos et al. | 341/101 |
| 5,790,058 A | * | 8/1998 | Burzio et al. | 341/101 |
| 5,808,571 A | * | 9/1998 | Kuwata et al. | 341/100 |
| 5,974,055 A | * | 10/1999 | Imanishi | 370/503 |
| 6,052,073 A | * | 4/2000 | Carr et al. | 341/100 |

* cited by examiner

Primary Examiner—Brian Young
Assistant Examiner—John Nguyen
(74) Attorney, Agent, or Firm—Daniel J. Piotrowski

(57) ABSTRACT

A circuit arrangement is described for converting a parallel data stream into a serial data stream and for intermediate storage and clocked supply of the data stream, which is characterized in that a first shift register (1) is provided in which the parallel data stream is stored in bit frames in dependence upon an externally supplied processor clock and which supplies a serial data stream by means of bit-wise scanning of the stored data, which serial data stream is applied in parallel to all memory locations of a second, bit-wise addressable shift register (2) from which the data stored therein are serially read in dependence upon a serial clock, and which supplies the serial data stream, in that the second shift register (2) is assigned to a load shift register (3) supplying a level indicator which constantly marks the limit between memory cells of the second shift register (2) with valid, stored data and memory cells which are to be newly written with data, and in that storage of the data supplied by the first shift register (1) in the second shift register (2) is effected in dependence upon the level indicator in such a way that a bit present in all memory cells of the second shift register (2) and supplied by the first shift register (1) is stored in that memory cell to be newly written with data which is most proximate to the level indicator and adjoins the memory cells written with valid data.

7 Claims, 1 Drawing Sheet

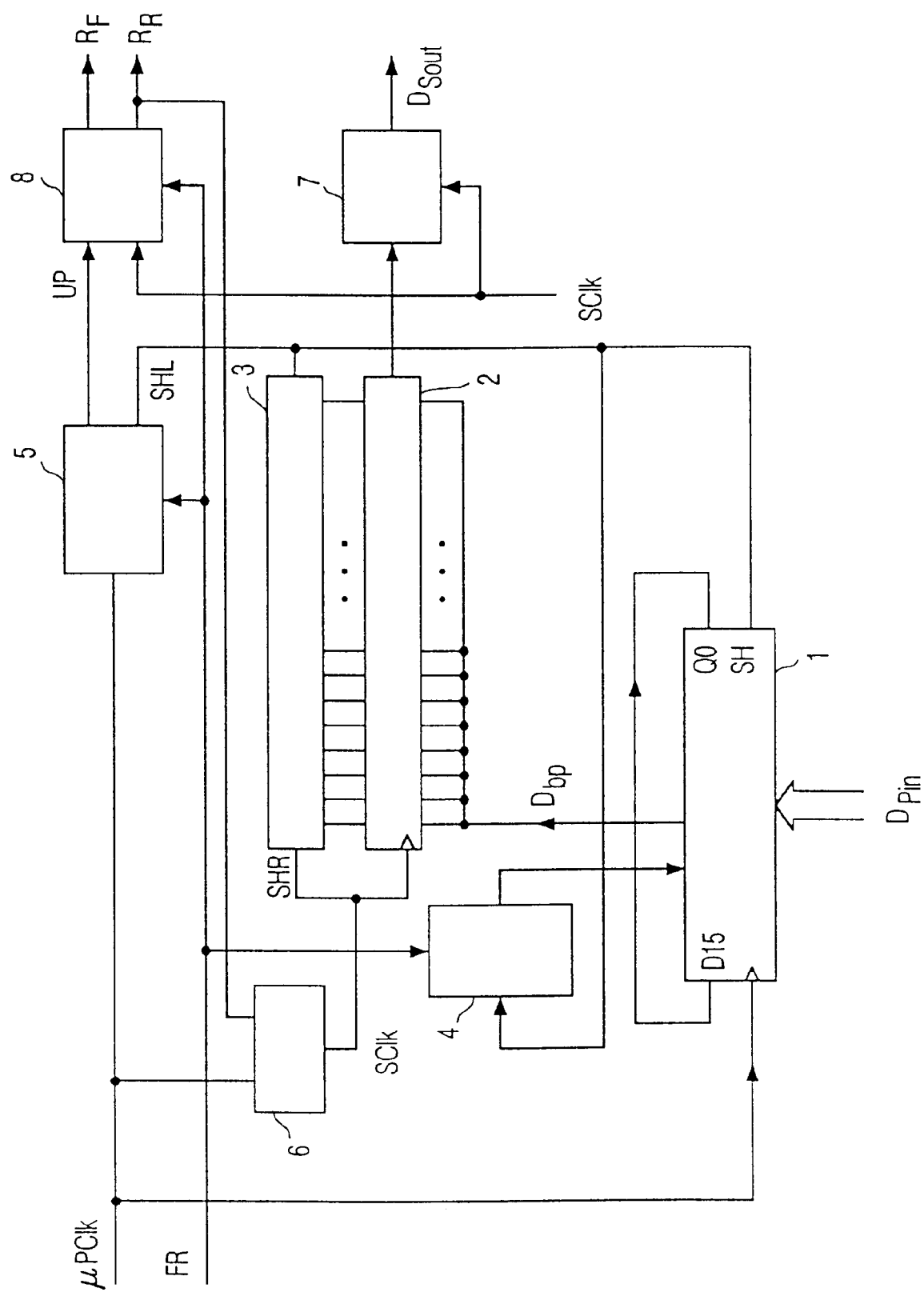

CIRCUIT ARRANGEMENT FOR PARALLEL/SERIAL CONVERSION

The invention relates to a circuit arrangement for converting a parallel data stream into a serial data stream and for intermediate storage and clocked supply of the data stream, and for reversibly converting of a serial data stream into a parallel data stream.

In known circuit arrangements for parallel/serial conversion, a memory control is required so that a pointer indicates the stack which is to be written as the next one and a further pointer indicates a stack which is to be read as the next one. Simultaneous access to both fields is not possible. Furthermore, adaptation of such a memory arrangement to different bit frame widths is not possible, or the available memory location is not completely utilized. Due to the required sequential processing, such an arrangement is not very fast. Moreover, it requires frequent use of software, i.e. use of a processor, which in turn is a burden for the processor which must normally perform other tasks.

It is an object of the invention to provide a circuit arrangement for parallel/serial conversion as well as for serial/parallel conversion which operates as fast as possible, requires minimal software control and can be flexibly used as far as the bit frame width is concerned.

In a circuit arrangement for parallel/serial conversion, this object is solved in that a first shift register is provided in which the parallel data stream is stored in bit frames in dependence upon an externally supplied processor clock and which supplies a serial data stream by means of bit-wise scanning of the stored data, which serial data stream is applied in parallel to all memory locations of a second, bit-wise addressable shift register from which the data stored therein are serially read in dependence upon a serial clock, and which supplies the serial data stream, in that the second shift register is assigned to a load shift register supplying a level indicator which constantly marks the limit between memory cells of the second shift register with valid, stored data and memory cells which are to be newly written with data, and in that storage of the data supplied by the first shift register in the second shift register is effected in dependence upon the level indicator in such a way that a bit present in all memory cells of the second shift register and supplied by the first shift register is stored in that memory cell to be newly written with data which is most proximate to the level indicator and adjoins the memory cells written with valid data.

The circuit arrangement has a first and a second shift register as central elements. The parallel data supplied by a microprocessor in a predetermined clock are parallel written into the first shift register.

In the case of dependence of a serial clock which may be derived, for example, from this processor clock, the bits stored in the first shift register are serially scanned bit-wise, i.e. for example, the bits of a frame are consecutively and individually transmitted to the second shift register. The second shift register has memory cells which can be individually addressed for the purpose of writing. For each individual bit, it can thus be freely decided which memory cell is to be written with the bit. To take this decision, a second shift register is assigned to a load shift register which comprises a level indicator. This may be, for example, a bit which is shifted through the memory cells of the load shift register. This level indicator constantly supplies information about the location of the limit between those memory cells in the second shift register which were already validly written with bits from the first shift register, and those memory cells which may already have been written but whose contents are not yet valid. The level indicator thus also marks that memory cell which is to be written as the next one with a bit coming from the first shift register. The storage of bits coming from the first shift register is therefore performed in dependence upon this level indicator.

Reading the data from the second shift register may be effected in dependence upon a serial clock which may be basically independent of the clock with which the first shift register is loaded.

The arrangement has the specific advantage that it operates on the basis of hardware because it is only dependent on the clock signals and on the level indicator which are available anyway or are generated as hardware within the arrangement. The arrangement thus requires a minimal use of the processor so that the processor from which, for example, the parallel data originate, is relieved from this burden. Furthermore, the parallel/serial conversion constantly takes place without any interruptions because there are no waiting times which are produced in known arrangements because it is not possible to simultaneously write and read in memory areas of a memory. The limitation of the operating speed of the arrangement is not only caused by the arrangement itself but also by the speed at which the data are supplied and requested.

Claim 2 describes an advantageous embodiment of this arrangement which allows a constant update of the level indicator in the load shift register in a simple manner. To this end, a shift signal is generated by means of a counter, which signal is applied to the load shift register and the first shift register. When, in dependence upon this shift signal, a new bit is read from the first shift register and written into the next memory cell to be written of the second shift register, the level of the level indicator in the load shift register is also corrected accordingly by this signal. After writing a memory cell, the level indicator will point at the next memory cell which is to be written. Furthermore, the serial clock at which the data are serially read from the second shift register is also applied to the load shift register so as to perform, conversely, a corresponding correction of the level indicator when a bit has been read from the second shift register. In this way, a constant correction of the level indicator is effected in dependence upon whether a new bit is read or written.

The above-described advantages of the arrangement according to the invention can be further improved in that the arrangement, as defined in claim 3, is formed in such a way that it can also process the variable frame widths of the parallel bits applied thereto. To this end, the first shift register has as many memory cells as are required for a maximum bit frame width, denoted as physical bit frame width. When actually parallel bits of a smaller, so-called logic frame width are supplied, then these bits are also parallel written into the first shift register. However, gaps are then produced which initially are not written by bits. A frame logic is provided which in the case of further shifting the bits in the first shift register tracks that bit which is to be read as the next one. To render this possible, the memory cells are constructed in such a way that the bit stored in each memory cell can be individually read. When there is a clock of the shift signal, the shift register is shifted further and also the frame logic will follow in accordance with the new position of the next bit to be read. Reading of this bit is controlled by the frame logic and is parallel supplied to all memory cells of the second shift register, in which storage takes place in dependence upon the level indicator.

In a further embodiment of the invention as defined in claim 5, the arrangement supplies two signals which signalize a complete filling of the second shift register or a relatively small filling level of this shift register. An arrangement which supplies the parallel data can thereby be controlled.

In principle, the described arrangement for parallel/serial conversion may also be used in the same construction for serial/parallel conversion. To this end, the measures as defined in claim 7 are preferably taken.

Also in this mode of operation, the same advantages are obtained because a mode of operation which is substantially independent of the use of software is also guaranteed in this case and the arrangement does not require any waiting state or the like.

In this mode of operation, the serially supplied data are stored in the second shift register in dependence upon an external serial clock. They are read again bit-wise from the memory cells of this shift register, with the level indicator now signalizing that memory cell from which the next bit is to be read. This bit is written into the first shift register. This process is repeated until a bit frame width of stored bits is present in the first shift register which can then be parallel read.

These and other aspects of the invention are apparent from and will be elucidated with reference to the embodiments described hereinafter.

In the drawing:

The sole FIGURE is a block diagram of an arrangement for converting a parallel data stream into a serial data stream.

The arrangement has a first shift register 1 which receives the parallel data stream $D_{pin}$. These parallel data may have a maximum frame width in accordance with which the arrangement is physically constructed, i.e. in accordance with which a corresponding number of parallel bits can be supplied and in accordance with which the first shift register 1 has memory cells which are not further shown in the Figure. As will be described hereinafter, the arrangement is, however, constructed in such a way that it can operate at a smaller bit frame width. This smaller bit frame width will hereinafter be referred to as logic bit frame width and should be dimensioned in such a way that the physical bit frame width is an integral multiple of the logic bit frame width.

The parallel data $D_{pin}$ are written into the first shift register in dependence upon a clock $\mu$PClk which may originate from, for example, a computer which supplies the parallel data.

In addition to the first shift register 1, a second shift register 2 is provided which is used to individually and bit-wise take over the data stored in the first shift register. The position and the memory cell of the second shift register in which a bit is taken over, is determined by a level indicator in a load shift register 3. The data are serially read from the second shift register and constitute the serial output current.

In the embodiment shown in the Figure, the first shift register 1 has 16 memory cells, i.e. the physical bit frame width is 16. The shift register is constructed in such a way that, with each shift signal applied to an input SH of the shift register, a shift clock is produced and the memory contents of the last memory cell 15 is fed back from an output D15 to a first memory cell 0 or its data input Q0.

A frame logic 4 is assigned to the first shift register 1, which frame logic receives the same shift signal as is used for shifting the data in the shift register 1 and also receives a signal FR which signalizes the logic frame width. With each shift process, the frame logic 4 tracks that bit in the shift register 1 which is to be read as the next one. This tracking is performed in dependence upon the logic bit frame width FR because empty memory cells occur in the first shift register in the case where the logic bit frame width is smaller than the physical bit frame width and where not always the last memory cell is that memory cell in which the next valid bit to be read is stored.

A counter 5 is provided to which the external processor clock $\mu$PClk, and the logic bit frame signal FR indicating the logic bit frame width are applied. The counter supplies a signal SHL which is used for the first shift register and, as described above, serves as a shift signal. This shift signal is also applied in a corresponding manner to the frame logic 4.

The signal SHL is further applied to the load shift register 3. In dependence upon this signal SHL, the position of the level indicator in the load shift register 3 is corrected in a corresponding manner with each bit taken over from the first shift register into the second shift register. The level indicator may be, for example, a simple bit which is shifted through the memory cells of the load shift register 3. The level indicator constantly marks the limit between the memory cells of the shift register 2 which have already received valid bits from the first shift register 1 and those memory cells which have not yet received valid data from the first shift register. The level indicator of the load shift register 3 thus constantly signalizes those memory cells which are the next ones to be overwritten with a new bit.

In a corresponding manner, the level indicator must also be corrected when a bit is read from the second shift register 2. For this purpose, the load shift register 3 as well as the shift register 2 receive a serial clock SClk which originates from a clock generator 6. The clock generator 6 receives the processor clock $\mu$PClk and a data request signal, which will be further described hereinafter.

The serial clock SClk supplied by the clock generator 6 thus serves for serially reading the bits stored in the second shift register. These bits constitute the serial data stream and are supplied as serial data stream $D_{Sout}$ t via a further buffer memory 7 in the embodiment shown in the FIGURE.

Furthermore, the serial clock also serves to correct the position of the level indicator in the load shift register 3 in accordance with the bits which have been read, since with each bit that has been read the other bits are shifted accordingly in the shift register 2 and the position of the next memory cell to be written changes accordingly.

As a result, the level indicator in the load shift register 3 constantly signalizes that memory cell which is the next to be written with new data from the first shift register.

The arrangement further comprises a signalizing logic 8 which supplies a "memory full" signal $R_F$ when all memory cells of the second shift register 2 are full. To this end, the signalizing logic receives a counting signal from the counter 5 and the serial clock SClk. Furthermore, the logic bit frame width should be known in this case so that the signal FR signalized by the signalizing logic is applied to this logic. Since, on the one hand, said signals signalize how many bits were read from the second shift register and, on the other hand, indicate how many bits were taken over by the arrangement in dependence upon the logic frame width, the memory level can be computed therefrom and, in the case of a too small memory level, the "memory-full" signal $R_F$ can be supplied. In a corresponding manner, the above-mentioned data request signal $R_R$ can be generated when the filling level of the second shift register 2 falls below a predeterminable value, i.e. when new parallel data $D_{Pin}$ can be taken over.

The arrangement particularly has the advantage that it does not need any external software or microprocessor control and thereby relieves, for example a microprocessor supplying the parallel data $D_{Pin}$ from a burden. This is achieved in that the arrangement operates substantially on the basis of hardware. Furthermore, the conversion of the parallel data into serial data can be performed constantly, because, in the arrangement, no problems can be created by the fact that a memory cannot be simultaneously written and read.

Due to the special construction of the first shift register 1, a logic bit frame width deviating from the physical bit frame width can also be processed. Even when, due to a logic frame width which is smaller than the physical bit frame width, empty or invalidly written memory cells are present in the first shift register after reading the parallel bits into this first shift register, it can be achieved by the feedback of the data of the last memory cell of the first shift register to its first memory cell, as well as by the frame logic which constantly tracks the next valid bit that the next valid bit can nevertheless be written into the second shift register with every clock of the shift signal SHL. It is thereby achieved that all memory cells of the second shift register are fully utilized and can be serially read again in an unchanged sequence and without any gaps.

The size of the logic bit frame width is taken into account when generating the shift clock SHL and when tracking the valid memory cell by means of the frame logic 4.

The arrangement shown in the Figure may basically also be used for serial/parallel conversion; then the logic processes are substantially reversed. The serial data are then serially read from the shift register 2. The level indicator in the load shift register 3 then serves to signalize the next valid bit which is written into the shift register 1. With every clock, the bits in the shift register I gather until the logic or physical bit frame width has been achieved and the bits are parallel readable from the first shift register. Also in this mode of operation, the logic bit frame width, at which the bits are parallel supplied by the first shift register 1, may deviate from the physical bit frame width.

What is claimed is:

1. A circuit arrangement for converting a parallel data stream into a serial data stream and for intermediate storage and clocked supply of the data stream, characterized in that a first shift register (1) is provided in which the parallel data stream is stored in bit frames in dependence upon an externally supplied processor clock and which supplies a serial data stream by means of bit-wise scanning of the stored data, which serial data stream is applied in parallel to all memory locations of a second, bit-wise addressable shift register (2) from which the data stored therein are serially read in dependence upon a serial clock, and which supplies the serial data stream, in that the second shift register (2) is assigned to a load shift register (3) supplying a level indicator which constantly marks the limit between memory cells of the second shift register (2) with valid, stored data and memory cells which are to be newly written with data, and in that storage of the data supplied by the first shift register (1) in the second shift register (2) is effected in dependence upon the level indicator in such a way that a bit present in all memory cells of the second shift register (2) and supplied by the first shift register (1) is stored in that memory cell to be newly written with data which is most proximate to the level indicator and adjoins the memory cells written with valid data.

2. A circuit arrangement as claimed in claim 1, characterized in that a counter (5) is provided which, in dependence upon the processor clock and the bit frame width, supplies a shift signal to the load shift register (3) and to the first shift register (1) so that the level indicator is corrected in accordance with each bit stored in the second shift register (2) and so that the first shift register (1) supplies the next bit, and in that the load shift register (3) receives the serial clock so as to accordingly correct the level indicator after each bit has been serially read from the second shift register (2).

3. A circuit arrangement as claimed in claim 2, characterized in that all memory cells of the first shift register (1) are individually readable, in that, with every shift process, the bit of the last memory cell of the first shift register (1) is written into the first memory cell, in that at a logic bit frame width with which the arrangement operates and which deviates from a physical bit frame width with which the bits can be parallel applied to the first shift register (1) and in accordance with which the first shift register (1) has memory cells, a frame logic (4) adapts the logic frame width to the physical frame width in such a way that, with each writing process of the parallel bits, a number of bits is stored in accordance with the bit frame width, and in that, in shift processes, the next bit to be scanned is constantly tracked and read in the next scanning process.

4. A circuit arrangement as claimed in claim 1, characterized in that those memory cells of the second shift register (2) in which a bit supplied by the first shift register (1) is stored are addressed in dependence upon the level indicator.

5. A circuit arrangement as claimed in claim 1, characterized in that the arrangement supplies a "register-full" signal when the memory cells of the first or the second shift register (1; 2) cannot take up any further data, and in that the arrangement supplies a data request signal when a predeterminable number of memory cells of the first and/or second shift register (1; 2) is empty.

6. A circuit arrangement as claimed in claim 1, characterized in that a clock generator (6) is provided which generates the serial clock in dependence upon the processor clock, the data request signal and further parameters, preferably a desired Baud rate.

7. A circuit arrangement for converting a serial data stream into a parallel data stream and for intermediate storage and clocked supply of the data stream, characterized in that a second shift register (2) is provided in which the serial data stream is stored in dependence upon a serial clock and from whose memory cells the stored data are read bit-wise and stored in memory cells of a first shift register (1) from which the data are parallel read bit frame-wise in dependence upon an external processor clock and which constitute parallel output data, in that the second shift register (2) is assigned to a load shift register (3) supplying a level indicator which constantly marks the limit between memory cells of the second shift register (2) with valid, stored data and memory cells whose data have already been stored in the first shift register (1), and in that the data of the second shift register (2) are read in dependence upon the level indicator in such a way that a bit to be read is read from that memory cell which is most proximate to the level indicator and adjoins the memory cells with data that have already been read.

* * * * *